United States Patent
Endo et al.

(10) Patent No.: US 11,608,419 B2
(45) Date of Patent: Mar. 21, 2023

(54) THERMALLY CONDUCTIVE SHEET

(71) Applicant: SHIN-ETSU CHEMICAL CO., LTD., Tokyo (JP)

(72) Inventors: Akihiro Endo, Annaka (JP); Yasuhisa Ishihara, Annaka (JP); Hisaharu Yamaguchi, Annaka (JP); Masahiro Moteki, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 242 days.

(21) Appl. No.: 16/480,851

(22) PCT Filed: Jan. 16, 2018

(86) PCT No.: PCT/JP2018/000891
§ 371 (c)(1),
(2) Date: Jul. 25, 2019

(87) PCT Pub. No.: WO2018/139240
PCT Pub. Date: Aug. 2, 2018

(65) Prior Publication Data
US 2021/0130561 A1    May 6, 2021

(30) Foreign Application Priority Data
Jan. 26, 2017 (JP) .............................. JP2017-011760

(51) Int. Cl.
| | | |
|---|---|---|
| *C08J 7/04* | (2020.01) |
| *B29C 35/02* | (2006.01) |
| *B32B 27/20* | (2006.01) |
| *C08K 3/20* | (2006.01) |
| *C08K 3/22* | (2006.01) |
| *H01L 23/373* | (2006.01) |
| *C08J 7/043* | (2020.01) |
| *C08J 7/044* | (2020.01) |
| *B32B 27/28* | (2006.01) |
| *B29K 83/00* | (2006.01) |

(52) U.S. Cl.
CPC .............. *C08J 7/0427* (2020.01); *B29C 35/02* (2013.01); *B32B 27/283* (2013.01); *C08J 7/043* (2020.01); *C08J 7/044* (2020.01); *C08K 3/20* (2013.01); *H01L 23/3737* (2013.01); *B29K 2083/00* (2013.01); *B29K 2995/0013* (2013.01); *C08J 2333/24* (2013.01); *C08J 2483/04* (2013.01); *C08K 2003/2227* (2013.01); *C08K 2201/001* (2013.01); *C08K 2201/005* (2013.01)

(58) Field of Classification Search
None
See application file for complete search history.

(56) References Cited

U.S. PATENT DOCUMENTS

| | | | |
|---|---|---|---|
| 4,574,879 A | 3/1986 | DeGree et al. | |
| 5,130,113 A * | 7/1992 | Kitayama | C01F 7/023 |
| | | | 423/629 |
| 7,537,837 B2 * | 5/2009 | Takei | B32B 25/04 |
| | | | 428/447 |
| 9,629,283 B2 * | 4/2017 | Soong | C09K 5/14 |
| 2002/0022127 A1 | 2/2002 | Katsuda et al. | |
| 2004/0067372 A1 | 4/2004 | Takei et al. | |
| 2010/0331471 A1 | 12/2010 | Yamamoto et al. | |
| 2011/0245373 A1 * | 10/2011 | Yoda | H01L 23/3737 |
| | | | 523/220 |
| 2014/0011012 A1 * | 1/2014 | Noda | C08L 53/025 |
| | | | 428/220 |
| 2017/0198188 A1 | 7/2017 | Ishihara et al. | |

FOREIGN PATENT DOCUMENTS

| | | |
|---|---|---|
| EP | 2 308 676 A1 | 4/2011 |
| JP | 2-24383 B2 | 5/1990 |
| JP | 8-174765 A | 7/1996 |
| JP | 9-199880 A | 7/1997 |
| JP | 2002-47009 A | 2/2002 |
| JP | 2004-122664 A | 4/2004 |
| JP | 2011-178821 A | 9/2011 |
| JP | 2012-121793 A | 6/2012 |
| JP | 2013-151655 A | 8/2013 |
| JP | 2015-233104 A | 12/2015 |
| TW | 200951072 A1 | 12/2009 |
| TW | 201121764 A1 | 7/2011 |

OTHER PUBLICATIONS

Extended European Search Report dated Sep. 14, 2020, in EP 18744161.3.
International Search Report, issued in PCT/JP2018/000891, PCT/ISA/210, dated Mar. 20, 2018.
Written Opinion of the International Searching Authority, issued in PCT/JP2018/000891, PCT/ISA/237, dated Mar. 20, 2018.
Taiwanese Office Action and Search Report for Taiwanese Application No. 107102617, dated Sep. 23, 2021.

* cited by examiner

*Primary Examiner* — Tae H Yoon
(74) *Attorney, Agent, or Firm* — Birch, Stewart, Kolasch & Birch, LLP

(57) ABSTRACT

A thermally conductive sheet in which a cured layer of a thermally conductive silicone composition is laminated on one or both sides of a synthetic resin film layer of aromatic polyimide, etc. having excellent heat resistance, electrical insulation, and mechanical strength, wherein good thermal conductivity, good insulation, and strong interlayer adhesion are provided because the thermally conductive silicone composition includes 250 to 600 wt. % of an aspherical thermally conductive filler material, which contains no more than 80 ml/100 g of a DOP oil absorption amount and an organic silicon compound component including an adhesion imparting agent, relative to 100 wt. % of the organic silicon compound component, and moreover the thermally conductive sheet with no brittleness during use can be made using continuous molding.

11 Claims, No Drawings

THERMALLY CONDUCTIVE SHEET

CROSS REFERENCE TO RELATED APPLICATIONS

This application is the National Phase of PCT International Application No. PCT/JP2018/000891, filed on Jan. 16, 2018, which claims priority under 35 U.S.C. 119(a) to Patent Application No. 2017-011760, filed in Japan on Jan. 26, 2017, all of which are hereby expressly incorporated by reference into the present application.

TECHNICAL FIELD

The present invention relates to a thermally conductive sheet. More particularly, the invention relates to a thermally conductive sheet for use as a heat transfer material that can be interposed between a heat-generating electronic component and a heat-dissipating member such as a heat sink.

BACKGROUND ART

Given current trends toward higher functionality, higher speeds, smaller sizes and higher integration, the transistors, diodes and other semiconductor devices that are used in electronic equipment such as converters and power supplies have come to generate large amounts of heat themselves. The rise in temperature of the equipment due to such heat triggers malfunctions and breakdowns. To address this problem, many heat-dissipating methods for suppressing temperature rises by semiconductor devices during operation, and heat-dissipating members for use in such methods, have been described.

For example, heat sinks that make use of aluminum, copper or other metal plates having a high thermal conductivity are used to hold down the temperature rise by semiconductor devices during operation in electronic equipment. Such a heat sink carries away the heat generated by the semiconductor device and discharges the heat from a surface by utilizing the temperature difference with outside air. At the same time, the semiconductor device and the heat sink must be electrically insulated from each other. A plastic film or the like is placed between the heat-generating electronic component and the heat sink for this purpose. However, because plastic film has an exceedingly low thermal conductivity, it greatly hinders heat transfer to the heat sink. Also, in cases where a semiconductor device such as a transistor is fastened with screws to the heat sink, the screws must pass through the plastic film. Holes are formed in the film for this purpose, but such holes can lead to tearing of the film, making it impossible to maintain the electrically insulating properties. The inability to maintain electrically insulating properties is lethal to transistors and diodes.

To help prevent tearing and impart heat conductivity, thermally conductive sheets have been developed which are made of glass cloth having a thermally conductive resin laminated thereon. One example is a thermally conductive sheet composed of glass cloth on which has been laminated a silicone rubber filled with boron nitride powder and spherical silica powder as thermally conductive fillers (Patent Document 1: JP-A H09-199880).

To ensure the electrically insulating properties of the thermally conductive sheet, multilayer structures have been proposed wherein a film of good heat resistance, electrically insulating properties and mechanical strength that is made of, for example, an aromatic polyimide, polyamide, polyamide-imide or polyethylene naphthalate is used as an intermediate layer and silicone rubber layers of excellent heat conductivity and electrical properties filled with beryllium oxide, aluminum oxide, aluminum hydroxide or the like are disposed as the outside layers. For example, Patent Document 2 (JP-B H02-24383) discloses a thermally conductive electrically insulating member comprising a laminate which is composed of at least three layers, including an intermediate layer that is a polyimide (amide) film filled with a quantity of aluminum oxide or the like and a pair of outer layers disposed on either side of the intermediate layer that are silicone rubber layers filled with a quantity of aluminum oxide or the like.

There are a number of drawbacks with these thermally conductive electrically insulating members having a multilayer structure. Namely, adhesion between the outer silicone rubber layers and the film of aromatic polyimide or the like serving as the intermediate layer is unstable, and so laminar separation tends to arise over time, resulting in a poor durability. One solution that has been proposed is a thermally conductive silicone rubber composite sheet (Patent Document 3: JP-A 2004-122664) characterized by including a laminate structure having, as outer layers, silicone rubber layers obtained by curing a composition that includes a silicon compound-based adhesion-imparting agent having at least one type of functional group selected from among epoxy, alkoxy and vinyl groups and the group of the formula Si—H.

Methods for producing these thermally conductive sheets include pressing and continuous forming. In order to carry out pressing, it is necessary to prepare a sheet of an appropriate size and to use an apparatus such as a pressing machine. This results in batch production, and so the completed thermally conductive sheet cannot be taken up into a roll. Such an operation is highly inefficient from the standpoint of productivity and yield. Moreover, the sheet stock size is subject to limitations, which in turn limits the sheet size when carrying out device packaging.

An example of a continuous forming process is coating. For instance, in the case of glass cloth, a thermally conductive sheet can be continuously produced by sealing the glass cloth with a thermally conductive silicone resin and then using a coating process to form a thermally conductive silicone rubber layer on the sealed glass cloth. In the case of synthetic resin film, a thermally conductive sheet can be continuously produced by using a coating process to form a thermally conductive silicone rubber layer on one or both sides of the synthetic resin film. In such a coating operation, the completed sheet can be continuously taken up, making production highly efficient. Also, even though the width of the sheet in the transverse direction is limited by the size of the coating machine, because there are no limitations on the sheet length in the machine direction, the degree of freedom in the size of the sheet during device packaging increases greatly compared with pressing. However, compared with pressing, a coating operation gives a poor surface precision, resulting in increased contact thermal resistance. Also, because pressure is not applied, an increase in the density of the silicone rubber layer is difficult to achieve. Hence, coating is unsuitable as a method for producing a sheet having a high thermal conductivity.

One way to achieve a good surface precision even with a coating process is the method of using a spherical thermally conductive filler to improve the flowability of the thermally conductive silicone resin. However, the grades of spherical thermally conductive fillers are limited and there are problems with each grade. For example, spherical alumina is relatively inexpensive, but because it has a high hardness, abrasion of the mixing tank arises during compounding, making maintenance of the production facilities more difficult and lowering the electrical insulating properties of the product. Agglomerated spherical powders such as aluminum nitride and boron nitride also exist, but these are very expensive, increasing the production costs of the thermally conductive sheet.

As for non-spherical thermally conductive fillers such as aluminum hydroxide which have relatively low material costs and possess electrical insulating properties, a drawback is that, because they have a large specific surface area and the amount in which such fillers can be loaded into silicone resin is limited, the thermal conductivity is low. Also, given that such fillers have a poor flowability, good surface precision is not obtained by coating and the contact thermal resistance worsens.

In addition, in thermally conductive sheets that employ a film of good heat resistance, electrical insulating properties and mechanical strength as the intermediate layer, when a thermally conductive filler having a large specific surface area is used, the adhesion-imparting agent adsorbs to the thermally conductive filler. This detaches over time and reacts with the silicone rubber, giving rise to embrittlement.

PRIOR ART DOCUMENTS

Patent Documents

Patent Document 1: JP-A H09-199880
Patent Document 2: JP-B H02-24383
Patent Document 3: JP-A 2004-122664

SUMMARY OF INVENTION

Technical Problem

It is therefore an object of this invention to provide a thermally conductive sheet which uses an inexpensive non-spherical thermally conductive filler, can be continuously produced by a coating process and taken up into a roll, and uses an aromatic polyimide or other synthetic resin film of good heat resistance, electrical insulating properties and mechanical strength, which thermally conductive sheet moreover has a high heat conductivity, a low contact thermal resistance, high electrical insulating properties and a strong interlaminar adhesion, and furthermore does not give rise to embrittlement during use.

Solution to Problem

The inventors have conducted extensive investigations in order to achieve this object. As a result, they have discovered that, in a thermally conductive sheet composed of an aromatic polyimide or other synthetic resin film layer of good heat resistance, electrical insulating properties and mechanical strength to one or both sides of which is laminated a cured layer of a thermally conductive silicone composition, by having the thermally conductive silicone composition include specific amounts of an adhesion-imparting agent-containing organosilicon compound component and a non-spherical thermally conductive filler having a specific DOP oil absorption, a thermally conductive sheet which is endowed with high heat conductivity, high electrical insulating properties and strong interlaminar adhesion and moreover does not give rise to embrittlement during use can be produced by continuous forming.

Accordingly, the invention provides the following thermally conductive sheet.

[1]

A thermally conductive sheet having an electrically insulating synthetic resin film layer and, on one or both sides of the synthetic resin film layer, a cured layer of a thermally conductive silicone composition, wherein the thermally conductive silicone composition includes an adhesion-imparting agent-containing organosilicon compound component and a non-spherical thermally conductive filler, the thermally conductive filler being included in an amount of from 250 to 600 parts by weight per 100 parts by weight of the organosilicon compound component and having a DOP oil absorption of 80 mL/100 g or less.

[2]

The thermally conductive sheet of [1], wherein the synthetic resin used in the synthetic resin film layer has a melting point of at least 100° C.

[3]

The thermally conductive sheet of [1] or [2], wherein the synthetic resin used in the synthetic resin film layer is an aromatic polyimide, a polyamide, a polyamide-imide, a polyester, a polyolefin, an aromatic polyether, a fluoropolymer, or a combination of two or more thereof.

[4]

The thermally conductive sheet of any of [1] to [3], wherein the adhesion-imparting agent in the thermally conductive silicone composition is a silicon compound-based adhesion-imparting agent having an epoxy group and/or an alkoxy group, and also having at least one group selected from a vinyl group and a group of the formula Si—H.

[5]

The thermally conductive sheet of [4], wherein the adhesion-imparting agent is selected from silicon compounds of the following formulas.

[Chem. 1]

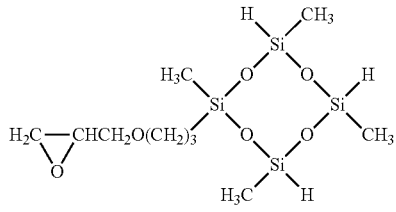

[Chem. 2]

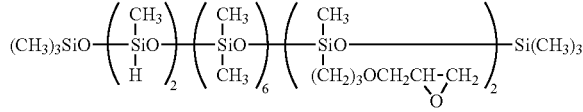

[Chem. 3]

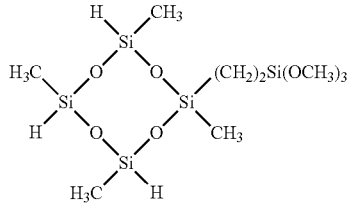

-continued

[Chem. 4]

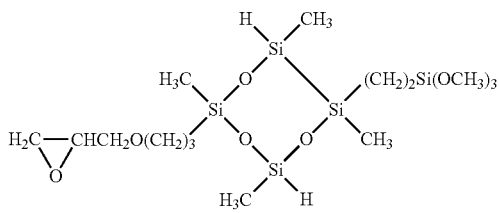

[Chem. 5]

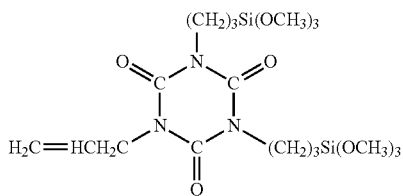

[6]
The thermally conductive sheet of any of [1] to [5], wherein the non-spherical thermally conductive filler in the thermally conductive silicone composition is aluminum hydroxide powder.

[7]
The thermally conductive sheet of [6], wherein the aluminum hydroxide powder includes:
(1) from 100 to 500 parts by weight of an aluminum hydroxide powder having an average particle size of from 5 to 14 μm and a DOP oil absorption of 50 mL/100 g or less, and
(2) from 50 to 400 parts by weight of an aluminum hydroxide powder having an average particle size of from 0.5 to 3 μm and a DOP oil absorption of 80 mL/100 g or less; with (1) accounting for at least 40 wt % of the overall amount of non-spherical thermally conductive filler.

[8]
The thermally conductive sheet of any of [1] to [7], wherein the non-spherical thermally conductive filler in the thermally conductive silicone composition has an amount of particles at least 45 μm in size of from 0 to 0.5 wt % and an amount of particles at least 75 μm in size of from 0 to 0.01 wt %.

[9]
The thermally conductive sheet of any of [1] to [8], wherein the organosilicon compound component in the thermally conductive silicone composition includes: (A) an organopolysiloxane of average compositional formula (1) below $$R^1_a SiO_{(4-a)/2} \qquad (1)$$

(wherein each $R^1$ is independently a substituted or unsubstituted monovalent hydrocarbon group of 1 to 10 carbon atoms, and the subscript 'a' is from 1.90 to 2.05) which has at least two silicon-bonded alkenyl groups per molecule.

[10]
The thermally conductive sheet of [9], wherein the organosilicon compound component in the thermally conductive silicone composition further includes (E) from 0.01 to 30 wt %, based on the total amount of the organosilicon compound component in the thermally conductive silicone composition, of one or more selected from:
(E1) alkoxysilanes of general formula (2) below $$R^2_b R^3_c Si(OR^4)_{4-b-c} \qquad (2)$$

(wherein each $R^2$ is independently an alkyl group of 6 to 15 carbon atoms, each $R^3$ is independently a substituted or unsubstituted monovalent hydrocarbon group of 1 to 12 carbon atoms, each $R^4$ is independently an alkyl group of 1 to 6 carbon atoms, b is an integer from 1 to 3, c is 0, 1 or 2, and the sum b+c is from 1 to 3), and
(E2) dimethylpolysiloxanes of general formula (3) below

[Chem. 6]

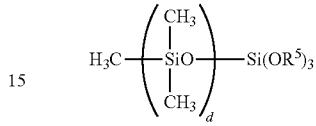

(wherein each $R^5$ is independently an alkyl group of 1 to 6 carbon atoms, and d is an integer from 5 to 100) that are capped at one end with a trialkoxysilyl group.

[11]
The thermally conductive sheet of [9] or [10], wherein the thermally conductive silicone composition further includes, as (C) a curing agent:
(C-1a) an organohydrogenpolysiloxane in an amount such that the total amount of silicon-bonded hydrogen atoms in the thermally conductive silicone composition per mole of the total amount of alkenyl groups in the thermally conductive silicone composition falls in the range of 0.8 to 10 moles; and
(C-1b) a platinum catalyst in an amount such that the level of platinum metal in the platinum catalyst with respect to component (A), expressed in weight units, is from 0.1 to 2,000 ppm.

[12]
The thermally conductive sheet of [9] or [10], wherein the thermally conductive silicone composition further includes, as (C) a curing agent:
(C-2) from 0.5 to 30 parts by weight of an organic peroxide per 100 parts by weight of the total amount of vinyl group-containing compounds in the thermally conductive silicone composition.

[13]
The thermally conductive sheet of any of [1] to [12], wherein the electrically insulating synthetic resin film layer has a thickness of from 5 to 90 μm, the cured layer of the thermally conductive silicone composition has a thickness of from 40 to 400 μm, and the overall thermally conductive sheet has a thickness of from 55 to 500 μm.

[14]
The thermally conductive sheet of any of [1] to [13], wherein the thermally conductive silicone composition, when cured, has a thermal conductivity of at least 1.2 W/m·K.

[15]
The thermally conductive sheet of any of [1] to [14] which has a dielectric breakdown voltage in air, as measured according to JIS K6249, of at least 2 kV.

Advantageous Effects of Invention

The thermally conductive sheet of the invention can be continuously produced by coating and taken up into a roll. Moreover, it not only has a cured layer of a thermally conductive silicone composition having a good heat conductivity owing to the inclusion of a thermally conductive filler, but also has a synthetic resin film layer of aromatic polyimide or the like endowed with excellent electrical insulating properties and mechanical strength, and therefore, owing to the reinforcing effects thereof, possesses sufficient strength and flexibility. In view of these points, the thermally conductive sheet of the invention is suitable as an electrically insulative heat dissipating member interposed between a heat-generating electronic or electrical component and a heat sink. Moreover, because the cured layer of thermally conductive silicone composition includes an adhesion-imparting agent, the cured layer of thermally conductive silicone composition and the synthetic resin film layer can be made to strongly adhere to one another. In addition, because a thermally conductive filler having a low DOP oil absorption is used, embrittlement of the sheet over time due to the adhesion-imparting agent does not arise. For this reason, the thermally conductive sheet of the invention also has an excellent durability.

DESCRIPTION OF EMBODIMENTS

The thermally conductive sheet of the invention has a cured layer of a thermally conductive silicone composition on one or both sides of an electrically insulating synthetic resin film layer. In this invention, when the thermally conductive sheet has a cured layer of thermally conductive silicone composition on both sides of the electrically insulating synthetic resin film layer, the synthetic resin film layer is referred to as the "intermediate layer."

[Synthetic Resin Film Layer]

The electrically insulating synthetic resin film layer used in the invention is not particularly limited, provided it is a synthetic resin film layer which has excellent electrically insulating properties, is flexible and has a high mechanical strength. Any such synthetic resin film layer that is known may be used. Examples of the synthetic resin include aromatic polyimides, polyamides, polyamide-imides, polyesters such as polyethylene terephthalate and polyethylene naphthalate, polyolefins, aromatic polyethers, and fluoropolymers such as polytetrafluoroethylene (PTFE) and tetrafluoroethylene-perfluoroalkyl vinyl ether copolymers. Use can also be made of films obtained from synthetic resins in which a thermally conductive powder has been dispersed and blended, and thermally conductive synthetic resin films in which the heat conductivity has been enhanced by increasing the crystallinity of the synthetic resin. Synthetic resins of increased crystallinity in which the above thermally conductive powder has been dispersed may also be used. In addition, two or more of these may be combined to form the synthetic resin film layer.

It is desirable for the synthetic resin used in the synthetic resin film layer to have a melting point of at least 100° C., preferably at least 150° C., more preferably at least 200° C., and even more preferably at least 250° C., because the heat resistance will then be excellent and neither a decline in mechanical strength nor deformation under heat will be likely to occur. Preferred examples of such synthetic resin film layers include, as heat-resistant films having a melting point of 250° C. or more, the aromatic polyimide films available under the trade name Kapton® from DuPont-Toray Co., Ltd.).

When the aforementioned fluoropolymers are used as the synthetic resin, in order to enhance adhesion, it is preferable to chemically etch the surface of the resulting synthetic resin film using a metallic Na/naphthalene-based treatment liquid.

The thickness of the synthetic resin film layer may be set according to the manner and purpose of use for the thermally conductive sheet of the invention and is not particularly limited, although it is preferably set in the range of about 5 to 90 μm, more preferably about 10 to 75 μm, and even more preferably about 10 to 40 μm. When the thickness is too large, this may impair the heat conductivity of the thermally conductive sheet of the invention. Conversely, when it is too small, the sheet may fail to exhibit the required strength or the electrically insulating performance may be inadequate.

The synthetic resin film layer used in this invention is preferably a synthetic resin film layer without holes that lower the electrically insulating properties.

[Cured Layer of Thermally Conductive Silicone Composition]

The thermally conductive silicone composition used in the invention includes an adhesion-imparting agent-containing organosilicon compound component and a non-spherical thermally conductive filler, the amount of the thermally conductive filler being from 250 to 600 parts by weight per 100 parts by weight of the organosilicon compound component and the thermally conductive filler having a DOP oil absorption of 80 mL/100 g or less.

The thermally conductive silicone composition is not particularly limited, provided that it includes specific amounts of an adhesion-imparting agent-containing organosilicon compound component and a non-spherical thermally conductive filler having a specific DOP oil absorption, although it is preferably one that includes the following components (A) to (D) and more preferably includes also components (E) and (F):

(A) an organopolysiloxane of average composition formula (1) below

(wherein $R^1$ is a substituted or unsubstituted monovalent hydrocarbon group of 1 to 10 carbon atoms, and the subscript 'a' is from 1.90 to 2.05) which has at least two silicon-bonded alkenyl groups per molecule, (B) an adhesion-imparting agent,
(C) a curing agent, and
(D) a non-spherical thermally conductive filler.
and optionally
(E) one or more selected from (E1) and (E2) below:
    (E1) alkoxysilanes of general formula (2) below

(wherein each $R^2$ is independently an alkyl group of 6 to 15 carbon atoms, each $R^3$ is independently a substituted or unsubstituted monovalent hydrocarbon group of 1 to 12 carbon atoms, each $R^4$ is independently an alkyl group of 1 to 6 carbon atoms, b is an integer from 1 to 3, c is 0, 1 or 2, and the sum b+c is from 1 to 3), and
    (E2) dimethylpolysiloxanes of general formula (3) below

[Chem. 7]

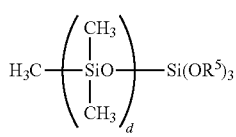

(3)

(wherein each $R^5$ is independently an alkyl group of 1 to 6 carbon atoms, and d is an integer from 5 to 100) that are capped at one end with a trialkoxysilyl group; and
(F) a plasticizer.

Component (A) used in the thermally conductive silicone composition according to the invention is an organopolysiloxane of average composition formula (1) below

$$R^1_a SiO_{(4-a)/2} \qquad (1)$$

(wherein $R^1$ is a substituted or unsubstituted monovalent hydrocarbon group of 1 to 10 carbon atoms, preferably from 1 to 8 carbon atoms, and the subscript 'a' is from 1.90 to 2.05) which has at least two silicon-bonded alkenyl groups per molecule, and serves as the base polymer of the thermally conductive silicone composition.

In formula (1). $R^1$ is exemplified by alkyl groups such as methyl, ethyl, propyl, butyl, pentyl, hexyl, heptyl, octyl, nonyl and decyl groups; cycloalkyl groups such as cyclopentyl and cyclohexyl groups; aryl groups such as phenyl, tolyl, xylyl and naphthyl groups; aralkyl groups such as benzyl, phenethyl and 3-phenylpropyl groups; halogen-substituted alkyl groups such as 3,3,3-trifluoropropyl and 3-chloropropyl groups; and alkenyl groups such as vinyl, allyl, butenyl, pentenyl and hexenyl groups. $R^1$ does not include epoxy-substituted groups and alkoxy-substituted groups.

Component (A) may be in the form of an oil or a gum.

Component (A) has an average degree of polymerization of preferably from 20 to 12,000, and more preferably from 50 to 10,000. In this invention, the average degree of polymerization can be determined as a polystyrene-equivalent value in gel permeation chromatography (GPC) using, for example, toluene or tetrahydrofuran (THF) as the developing solvent. The average degree of polymerization is typically determined as, for example, the number-average degree of polymerization (the same applies below).

Component (A) is an ingredient which is cured by an addition reaction or with a peroxide. It has at least two, preferably at least three, silicon-bonded alkenyl groups per molecule. The amount of alkenyl groups is preferably from 0.0002 to 0.5 mol/100 g. At a silicon-bonded alkenyl group content smaller than this range, when curing is carried out by an addition reaction, the resulting composition does not fully cure.

The alkenyl groups are preferably vinyl groups. The alkenyl groups may be bonded to either silicon atoms at the ends of the molecular chain or to silicon atoms other than at the ends of the molecular chain. It is preferable for at least one alkenyl group to be bonded to a silicon atom at an end of the molecular chain.

Specific examples of component (A) in cases where curing is carried out by an addition reaction include dimethylsiloxane-methylvinylsiloxane copolymers capped at both ends of the molecular chain with trimethylsiloxy groups,
methylvinylpolysiloxanes capped at both ends of the molecular chain with trimethylsiloxy groups,
dimethylsiloxane-methylvinylsiloxane-methylphenylsiloxane copolymers capped at both ends of the molecular chain with trimethylsiloxy groups,
dimethylpolysiloxanes capped at both ends of the molecular chain with dimethylvinylsiloxy groups,
methylvinylpolysiloxanes capped at both ends of the molecular chain with dimethylvinylsiloxy groups,
dimethylsiloxane-methylvinylsiloxane copolymers capped at both ends of the molecular chain with dimethylvinylsiloxy groups,
dimethylsiloxane-methylvinylsiloxane-methylphenylsiloxane copolymers capped at both ends of the molecular chain with dimethylvinylsiloxy groups, and
dimethylpolysiloxanes capped at both ends of the molecular chain with trivinylsiloxy groups. These may be used singly or two or more may be used in combination.

Specific examples of component (A) in cases where curing is carried out using a peroxide include dimethylpolysiloxanes capped at both ends of the molecular chain with dimethylvinylsiloxy groups, dimethylpolysiloxanes capped at both ends of the molecular chain with methylphenylvinylsiloxy groups, dimethylsiloxane-methylphenylsiloxane copolymers capped at both ends of the molecular chain with dimethylvinylsiloxy groups, dimethylsiloxane-methylvinylsiloxane copolymers capped at both ends of the molecular chain with dimethylvinylsiloxy groups, dimethylsiloxane-methylvinylsiloxane copolymers capped at both ends of the molecular chain with trimethylsiloxy groups, methyl(3,3,3-trifluoropropyl)polysiloxanes capped at both ends of the molecular chain with dimethylvinylsiloxy groups, dimethylsiloxane-methylvinylsiloxane copolymers capped at both ends of the molecular chain with silanol groups, and dimethylsiloxane-methylvinylsiloxane-methylphenylsiloxane copolymers capped at both ends of the molecular chain with silanol groups. These may be used singly or two or more may be used in combination.

Component (A) is preferably included within a range of 50 to 95 wt %, especially 60 to 90 wt %, of the total amount of organosilicon compound ingredients included in the thermally conductive silicone composition.

An adhesion-imparting agent (B) is included in the thermally conductive silicone composition according to the invention. By including the adhesion-imparting agent in the thermally conductive silicone composition, the synthetic resin film layer and the cured layer of thermally conductive silicon composition exhibit strong adhesion to one another, and thus can be rendered into a product that does not exhibit laminar separation and has excellent durability over time. Also, the step of carrying out primer treatment for the purpose of increasing adhesion with the synthetic resin film layer can be omitted, enabling the thermally conductive sheet production process to be simplified. Moreover, the lack of a primer layer makes it possible to obtain a thermally conductive sheet that does not have reduced heat conductivity.

This adhesion-imparting agent is preferably a silicon compound having an epoxy group and/or an alkoxy group, and also having at least one group selected from a vinyl group and a group of the formula Si—H.

In cases where the curing agent included in the thermally conductive silicone composition is a hydrosilylation curing agent, the silicon compound serving as the adhesion-imparting agent more preferably has an epoxy group, an alkoxy group or both of these, and also a vinyl group, a group of the formula Si—H or both of these; and still more preferably has an epoxy group, an alkoxy group or both of these, and also a group of the formula Si—H. When a silicon compound having a group of the formula Si—H is used as the adhesion-imparting agent, it can also act as the organohydrogenpolysiloxane which serves as the subsequently described curing agent (C).

In another preferred embodiment, in cases where the curing agent included in the thermally conductive silicone composition is an organic peroxide curing agent, the silicon compound serving as the adhesion-imparting agent more preferably has an epoxy group, an alkoxy group or both of these, and also a vinyl group, a group of the formula Si—H or both of these.

Specific examples of silicon compounds having such a group include, but are not limited to, those mentioned below.

[Chem. 8]

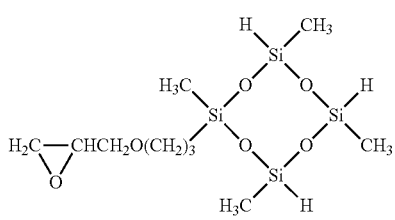

[Chem. 9]

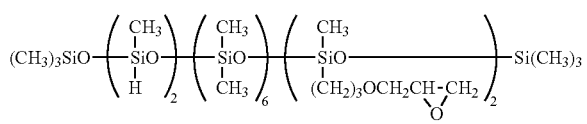

[Chem. 10]

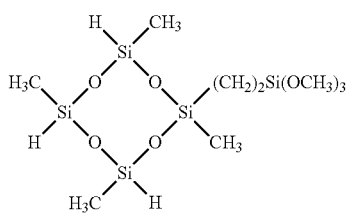

[Chem. 11]

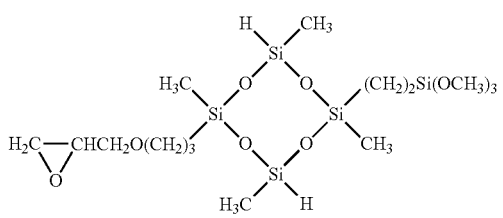

[Chem. 12]

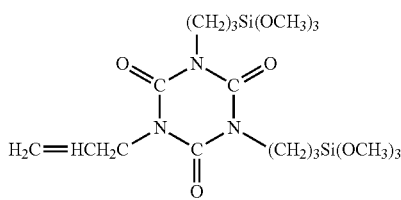

The adhesion-imparting agent may be of one type used alone or two or more may be used in combination.

The adhesion-imparting agent (B) content may be set to generally from 0.1 to 20 wt %, and preferably from 0.5 to 15 wt %, of the total amount of organosilicon compound component included in the thermally conductive silicone composition. When this content is too small, an adhesion-imparting effect may not be exhibited; when it is too large, problems that may arise include a loss of mechanical properties and embrittlement due to hardening over time.

Component (C) is a curing agent. In cases where curing of the thermally conductive silicone composition is carried out via an addition reaction, an organohydrogenpolysiloxane is used as the curing agent (C) and the reaction is carried out in the presence of a platinum catalyst. In cases where curing is carried out with a peroxide, an organic peroxide is used as the curing agent (C).

Here, in cases where the thermally conductive silicone composition is cured via an addition reaction (hydrosilylation reaction), the curing agent that is included is one consisting of an organohydrogenpolysiloxane having an average of at least 2, especially from 2 to 30, silicon-bonded hydrogen atoms per molecule and a platinum catalyst.

Silicon-bonded groups other than hydrogen atoms in this organohydrogenpolysiloxane are exemplified by monovalent hydrocarbon groups of 1 to 10, preferably 1 to 8, carbon atoms that contain no aliphatic unsaturated bonds. Specific examples include linear alkyl groups such as methyl, ethyl, propyl, butyl, pentyl, hexyl, heptyl and octyl groups; branched alkyl groups such as isopropyl, isobutyl, sec-butyl and tert-butyl groups; cyclic alkyl groups such as cyclopentyl and cyclohexyl groups; aryl groups such as the phenyl group; aralkyl groups such as benzyl and phenethyl groups; and halogenated alkyl groups such as 3,3,3-trifluoropropyl and 3-chloropropyl groups. Alkyl groups and aryl groups are preferred, with methyl and phenyl groups being especially preferred.

This organohydrogenpolysiloxane has a viscosity at 25° C. which, although not limited, is preferably in the range of 5 to 300 mm$^2$/s, and more preferably in the range of 10 to 200 mm$^2$/s. The molecular structure of this organohydrogenpolysiloxane is exemplified by, but not limited to, linear structures, branched structures, linear structures with some branching, cyclic structures and dendritic structures. The organohydrogenpolysiloxane may be, for example, homopolymers having these molecular structures, copolymers made up of these molecular structures, or a mixture thereof.

Examples of such organohydrogenpolysiloxanes include dimethylpolysiloxanes capped at both ends of the molecular chain with dimethylhydrogensiloxy groups, dimethylsiloxane-methylhydrogensiloxane copolymers capped at both ends of the molecular chain with trimethylsiloxy groups, dimethylsiloxane-methylhydrogensiloxane copolymers capped at both ends of the molecular chain with dimethylhydrogensiloxy groups, organosiloxane copolymers consisting of siloxane units of the formula $(CH_3)_3SiO_{1/2}$, siloxane units of the formula $(CH_3)_2HSiO_{1/2}$ and siloxane units of the formula $SiO_{4/2}$, and mixtures of two or more thereof.

In this composition, the content of this organohydrogenpolysiloxane is the amount required to cure the composition. Specifically, the content is such that the amount of silicon-bonded hydrogen atoms in this component or, in cases where the above adhesion-imparting agent (B) includes Si—H groups, the combined amount of Si—H groups in this component and component (B), per mole of silicon-bonded alkenyl groups in component (A) or, in cases where the above adhesion-imparting agent (B) includes vinyl groups, per mole of the combined amount of alkenyl groups in components (A) and (B), is preferably in the range of 0.8 to 10 moles, more preferably in the range of 1 to 8 moles, and most preferably in the range of 1.2 to 5 moles. When the content of this component is an amount below the lower limit of this range, curing is inadequate, as a result of which a sufficient sheet strength may not be obtained or oil bleeding may be promoted. When the content exceeds the upper limit of this range, the sheet may become brittle or foaming may occur.

The platinum catalyst is a catalyst for promoting curing of this composition. Illustrative examples include chloroplatinic acid, alcohol solutions of chloroplatinic acid, olefin complexes of platinum, alkenyl siloxane complexes of platinum, and carbonyl complexes of platinum.

In this composition, the content of the platinum catalyst is the amount required to cure the composition. Specifically, it is desirable for the catalyst content to be such that the amount of platinum metal in this component, in weight units relative to component (A), is preferably from 0.1 to 2,000 ppm, and more preferably from 10 to 1,000 ppm. At a content of this component below the lower limit of this range, curing is inadequate, as a result of which a sufficient sheet strength may not be obtained or oil bleeding may be promoted. At a content in excess of the upper limit of this range, the sheet may become brittle or foaming may arise.

In cases where the composition cures via a free radical reaction, the curing agent is an organic peroxide. Examples of the organic peroxide include benzoyl peroxide, di(p-methylbenzoyl) peroxide, di(o-methylbenzoyl) peroxide, dicumyl peroxide, 2,5-dimethyl-2,5-bis(tert-butylperoxy) hexane, di-tert-butyl peroxide and tert-butyl peroxybenzoate.

The content of this organic peroxide is the amount required to cure the composition. Specifically, the content is preferably from 0.5 to 30 parts by weight, and more preferably from 1 to 20 parts by weight, per 100 parts by weight of component (A) or, in cases where the adhesion-imparting agent (B) includes vinyl groups, the combined amount of components (A) and (B). At an organic peroxide content below the lower limit of this range, curing is inadequate, as a result of which a sufficient sheet strength may not be obtained or oil bleeding may be promoted. At a content in excess of the upper limit of this range, the sheet may become brittle or foaming may arise.

The non-spherical thermally conductive filler (D) included in the thermally conductive silicone composition of the present invention may be one that is commonly used, examples of which include non-magnetic metals such as copper and aluminum; metal oxides such as alumina, silica, magnesia, red iron oxide, beryllia, titania and zirconia; metal nitrides such as aluminum nitride, silicon nitride and boron nitride; metal hydroxides such as aluminum hydroxide and magnesium hydroxide; synthetic diamond and silicon carbide. These may be used singly or two or more may be used in combination.

The non-spherical thermally conductive filler has a DOP oil absorption of 80 mL/100 g or less, preferably 60 mL/100 g or less. When the DOP oil absorption exceeds this upper limit, the ability of the thermally conductive filler to be loaded into the organosilicon compound component decreases, the flowability during coating is lost and the smoothness of the sheet surface is compromised, leading to a rise in thermal resistance. Also, a high loading of the thermally conductive filler becomes difficult to achieve, which is disadvantageous in terms of heat conductivity. The DOP oil absorption is preferably at least 10 mL/100 g. The DOP oil absorption is the amount of oil (di-2-ethylhexyl phthalate) that is needed to achieve a stiff, putty-like state when the thermally conductive filler is worked together with the oil.

The non-spherical thermally conductive filler has an amount of particles at least 45 μm in size that is preferably from 0 to 0.5 wt %, and more preferably from 0 to 0.2 wt %, and has an amount of particles at least 75 μm in size that is preferably from 0 to 0.01 wt %, and more preferably 0 wt %. At an amount of particles at least 45 μm in size and an amount of particles at least 75 μm in size which exceed these limits, when a thermally conductive sheet is obtained by coating the thermally conductive silicone composition, the thermally conductive filler may protrude from the surface of the applied film, compromising the smoothness of the sheet surface. This invites a rise in the contact thermal resistance at the time of device packaging, which is disadvantageous in terms of heat conductivity.

The amount of particles at least 45 μm in size and the amount of particles at least 75 μm in size within the non-spherical thermally conductive filler are determined in the following way. Ten grams of the thermally conductive filler is sampled and then placed in a given amount of water and ultrasonically dispersed. Screens with opening sizes of 45 μm and 75 μm are placed on top of one another and set in a sieve shaker, and the thermally conductive filler dispersed in water is charged into the sieve shaker. The thermally conductive filler remaining on each screen is dried and weighed.

Taking into overall account such considerations as heat conductivity, electrical insulating properties, specific gravity, fire retardance and cost, the non-spherical thermally conductive filler is preferably aluminum hydroxide. In particular, when the non-spherical thermally conductive filler is composed of:

(1) an aluminum hydroxide powder having an average particle size of from 5 to 14 μm, preferably at least 5 μm and less than 12 μm, an amount of particles at least 45 μm in size of from 0 to 0.5 wt %, preferably from 0 to 0.2 wt %, an amount of particles at least 75 μm in size of from 0 to 0.1 wt %, preferably 0 wt %, and a DOP oil absorption of 50 mL/100 g or less, preferably 40 mL/100 g or less, and (2) an aluminum hydroxide powder having an average particle size of from 0.5 to 3 μm preferably at least 0.5 μm and less than 2 μm, an amount of particles at least 45 μm in size of from 0 to 0.5 wt %, preferably from 0 to 0.2 wt %, an amount of particles at least 75 μm in size of from 0 to 0.1 wt %, preferably 0 wt %, and a DOP oil absorption of 80 mL/100 g or less, preferably 60 mL/100 g or less, with the amount of component (1) per 100 parts by weight of the organosilicon compound component being from 100 to 500 parts by weight, preferably from 150 to 400 parts by weight, the amount of component (2) per 100 parts by weight of the organosilicon compound component being from 50 to 400 parts by weight, preferably from 80 to 300 parts by weight (the sum of the non-spherical thermally conductive fillers being as described above), and component (1) accounting for preferably at least 40 wt %, more preferably at least 50 wt %, of the total amount of the non-spherical thermally conductive filler, it is possible to attain a high loading of the thermally conductive filler in the silicone resin without a loss of flowability during coating, enabling the surface of the thermally conductive sheet that is formed to be made even smoother while achieving a high thermal conductivity.

The average particle size in this invention is a volume-based value determined using the Microtrac MT-3300EX (Nikkiso Co., Ltd.), a laser diffraction scattering-type particle size analyzer.

The content of the non-spherical thermally conductive filler (D) in the thermally conductive silicone composition is from 250 to 600 parts by weight, preferably from 300 to 570 parts by weight, and more preferably from 350 to 550 parts by weight, per 100 parts by weight of the organosilicon compound components. At a content of the non-spherical thermally conductive filler below this lower limit, sufficient heat conductivity is not obtained. At a content in excess of this upper limit, loading of the filler into the silicone becomes difficult. Even when such loading is possible, the thermally conductive filler becomes too dense, leading to, when a thermally conductive sheet is obtained by coating the composition, a loss of smoothness of the sheet surface and a rise in thermal resistance.

Here, "organosilicon compound components" refers to above component (A), component (B) when it is a silicon compound and, where present, the subsequently described component (E), the subsequently described component (F) and the organohydrogenpolysiloxane serving as the above-described curing agent (C). "Total amount of organosilicon compound components" refers to the sum of the amount of the above-described component (A), component (B) when it is a silicone compound and, where present, the subsequently described component (E), the subsequently described component (F) and the organohydrogenpolysiloxane serving as the above-described curing agent (C).

The thermally conductive silicone composition of the invention may additionally include component (E). Component (E) is one or more selected from components (E1) and (E2) below. Component (E) improves the wettability of the non-spherical thermally conductive filler (D) and makes it easier to load the thermally conductive filler into the organosilicon compound components, thereby enabling the content of the thermally conductive filler to be increased.

Component (E1) is an alkoxysilane of general formula (2) below.

$$R^2_b R^3_c Si(OR^4)_{4-b-c} \quad (2)$$

(wherein each $R^2$ is independently an alkyl group of 6 to 15 carbon atoms, each $R^3$ is independently a substituted or unsubstituted monovalent hydrocarbon group of 1 to 12 carbon atoms, each $R^4$ is independently an alkyl group of 1 to 6 carbon atoms, b is an integer from 1 to 3, c is 0, 1 or 2, and the sum b+c is from 1 to 3).

In formula (2), the alkyl group represented as $R^2$ is exemplified by hexyl, octyl, nonyl, decyl, dodecyl and tetradecyl groups. By having the number of carbon atoms on this alkyl group represented by $R^2$ be from 6 to 15, the wettability of the non-spherical thermally conductive filler (D) increases sufficiently, making it easy to load the thermally conductive filler into the thermally conductive silicone composition, in addition to which the low-temperature properties of the composition improve.

The substituted or unsubstituted monovalent hydrocarbon group of 1 to 12 carbon atoms represented by $R^3$ is exemplified by alkyl groups such as methyl, ethyl, propyl, isopropyl, butyl, isobutyl, tert-butyl, pentyl, neopentyl, hexyl, heptyl, octyl, nonyl, decyl and dodecyl groups; cycloalkyl groups such as cyclopentyl, cyclohexyl and cycloheptyl groups; aryl groups such as phenyl, tolyl, xylyl, naphthyl and biphenylyl groups; aralkyl groups such as benzyl, phenylethyl, phenylpropyl and methylbenzyl groups; and any of these groups in which some or all hydrogen atoms are substituted with halogen atoms such as fluorine, chlorine or bromine or with cyano groups, illustrative examples of which include chloromethyl, 2-bromoethyl, 3-chloropropyl, 3,3,3-trifluoropropyl, chlorophenyl, fluorophenyl, cyanoethyl and 3,3,4,4,5,5,6,6,6-nonafluorohexyl groups. $R^3$ is preferably a monovalent hydrocarbon group of 1 to 10 carbon atoms, and more preferably 1 to 6 carbon atoms, that has no aliphatic unsaturated bonds. Substituted or unsubstituted alkyl groups of 1 to 3 carbon atoms such as methyl, ethyl, propyl, chloromethyl, bromoethyl, 3,3,3-trifluoropropyl and cyanoethyl groups, and substituted or unsubstituted phenyl groups such as phenyl, chlorophenyl and fluorophenyl groups are especially preferred. $R^3$ contains no epoxy substituents and alkoxy substituents.

The alkyl group represented by $R^4$ is exemplified by alkyl groups of 1 to 6 carbon atoms, such as methyl, ethyl, propyl, butyl, pentyl and hexyl groups.

Component (E2) is a dimethylpolysiloxane of general formula (3) below

[Chem. 13]

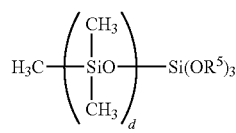

(3)

(wherein each R is independently an alkyl group of 1 to 6 carbon atoms, and d is an integer from 5 to 100, preferably from 10 to 50) which is capped at one end of the molecular chain with a trialkoxysilyl group.

The alkyl group represented by $R^5$ is exemplified in the same way as the alkyl group represented by $R^4$ in formula (2).

When component (E) is included, the content thereof is preferably from 0.01 to 30 wt %, and more preferably from 5 to 20 wt %, of the total amount of organosilicon compound components. At a content below this lower limit, it may be difficult to load the non-spherical thermally conductive filler (D) into the organosilicon compound components. At a content in excess of this upper limit, the strength of the resulting cured product may be inadequate.

The thermally conductive silicone composition of the invention may additionally include the plasticizer (F) described below. Component (F) is preferably a dimethylsiloxane of formula (4) below

[Chem. 14]

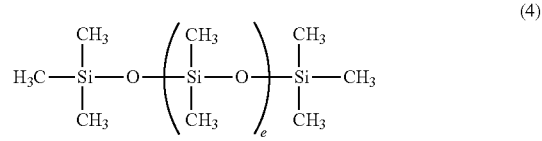

(4)

(wherein e is an integer from 5 to 500, preferably an integer from 50 to 400).

When component (F) is included, the content thereof is preferably from 0.5 to 20 wt %, and more preferably from 1 to 15 wt %, of the total amount of the organosilicon compound components. At a content below this lower limit, the sheet may have a higher hardness and become brittle. At a content in excess of this upper limit, a sufficient sheet strength may not be obtained or oil bleeding may be promoted.

The thermally conductive silicone composition can be prepared as follows. Components (A) and (D), along with components (E) and (F) when these are included, are mixed using a mixer such as a kneader, a Banbury mixer, a planetary mixer or a Shinagawa mixer while optionally heating at a temperature of 100° C. or more. In this mixing step, reinforcing silicas such as fumed silica and precipitated silica, silicone oils, silicone wetting agents, and flame retardants such as platinum, titanium oxide and benzotriazole may be added where desired within ranges that do not compromise the heat-conducting performance. The uniform mixture obtained in the mixing step is cooled to room temperature, following which it is filtered by being passed through a strainer or the like. Next, using a two-roll mill, a Shinagawa mixer or the like, the required amounts of adhesion-imparting agent (B) and curing agent (C) are added to this mixture, and mixing is again carried out. In this second mixing step, if desired, an acetylene compound-type addition reaction regulator such as 1-ethynyl-1-cyclohexanol, a colorant such as an organic pigment or an inorganic pigment, a heat resistance improver such as iron oxide or cerium oxide, and an internal mold release agent may be added. The thermally conductive silicone composition thus obtained may be directly furnished to the next step as a coating material, although a solvent such as toluene may also be added if necessary.

In curing via an addition reaction, the curing conditions for this thermally conductive silicone composition are preferably set to from 80 to 180° C., especially from 100 to 160°

C. for a period of from 30 seconds to 20 minutes, especially from 1 to 10 minutes. In curing with an organic peroxide, the conditions are preferably set to from 100 to 180° C., especially from 110 to 170° C., for a period of from 30 seconds to 20 minutes, especially from 1 to 10 minutes.

The cured form of the thermally conductive silicone composition has a thermal conductivity of preferably at least 1.2 W/m·K, more preferably at least 1.5 W/m·K, and even more preferably at least 1.7 W/m·K. The thermal conductivity can be measured using the TPS-2500S from Kyoto Electronics Manufacturing Co., Ltd.

The thermally conductive sheet of the invention has a cured layer of the above thermally conductive silicone composition (thermally conductive cured layer) on one or both sides of a synthetic resin film layer.

As subsequently described, the thermally conductive sheet is obtained by coating and curing the thermally conductive silicone composition on one or both sides of a synthetic resin film layer. Such coating is carried out such that the thickness of the layer of cured composition after it has cured is preferably at least 40 µm and not more than 400 µm, and more preferably at least 50 µm and not more than 300 µm. When the thickness of the cured layer is too small, the thermally conductive filler included therein protrudes, which may compromise the smoothness at the surface of the thermally conductive cured layer. When the thickness is too large, the thermally conductive sheet may end up having a high thermal resistance. When a cured layer of the thermally conductive silicone composition is formed on both sides of a synthetic resin film layer, the cured layers of the thermally conductive silicone composition on the two sides may have the same thickness or may have differing thicknesses.

The thermally conductive sheet of the invention is continuously produced by coating the thermally conductive silicone composition onto one or both sides of a synthetic resin film layer to form a thermally conductive cured layer (or layers). The thermally conductive cured layer is formed by, for example, continuously applying the thermally conductive silicone composition obtained as described above onto one side (referred to here as "the front side") of a synthetic resin film using a conventional coating apparatus such as a comma coater, knife coater or kiss coater equipped with a drying oven, a heating oven and a take-up device, subsequently drying/evaporating off the solvent, etc. and then, in the case of curing by an addition reaction, heating at from about 80° C. to about 180° C., preferably from about 100° C. to about 160° C., for a period of from 30 seconds to 20 minutes, especially from 1 to 10 minutes, or, in the case of curing with a peroxide, heating at from about 100° C. to about 180° C., preferably from about 110° C. to about 170° C., for a period of from 30 seconds to 20 minutes, especially from 1 to 10 minutes. When coating is carried out on both sides, the thermally conductive sheet is obtained by forming a thermally conductive cured layer on the other side (referred to here as the "back side") of the synthetic resin film layer as well in the same way as on the front side. Coating on the front side and coating on the back side may be carried out at the same time. The completed thermally conductive sheet is continuously taken up into a roll. The thermally conductive silicone compositions on the front and back sides may be mutually the same or may be different.

The thickness of the thermally conductive sheet may be set according to the manner and purpose of use and is not particularly limited, although it is preferably set in the range of about 55 to about 500 µm, and more preferably about 100 to about 300 µm. In general, when this thickness is too small, the shape conformity to electronic components worsens, and so there is a tendency for the heat conductivity to worsen. On the other hand, when the thickness is too large, there is a tendency for the heat transfer properties to be lost. Neither situation is desirable.

It is desirable for the thermally conductive sheet thus obtained to have a dielectric breakdown voltage in air, as measured in accordance with JIS K6249, of at least 2 kV, and more preferably at least 4 kV. The dielectric breakdown voltage in air is substantially proportional to the thickness of the thermally conductive sheet.

EXAMPLES

The invention is illustrated more fully below by way of Examples and Comparative Examples, although the invention is not limited by these Examples.

The materials used in the Examples and Comparative Examples were as follows.

Component (A):
(A1) A dimethylpolysiloxane having an average degree of polymerization of 8,000 and capped at both ends with dimethylvinyl groups
(A2) A dimethylpolysiloxane having an average degree of polymerization of 3,000 and capped at both ends with dimethylvinyl groups Component (B):
(B1) The silicon compound of formula (5) below

[Chem. 15]

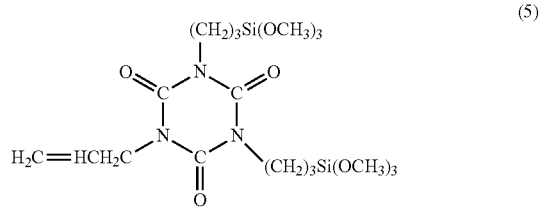

(B2) The silicon compound of formula (6) below

[Chem. 16]

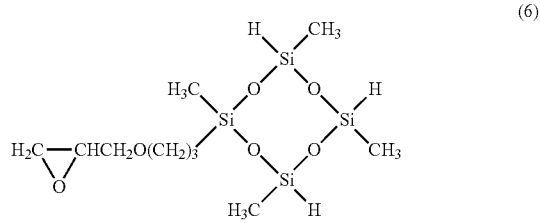

Component (C): 2-Methylbenzoyl peroxide

Component (D):
(D1) Irregularly shaped (non-spherical) aluminum hydroxide powder having an average particle size of 9.3 µm, an amount of particles at least 45 µm in size of 0.04 wt %, an amount of particles at least 75 µm in size of 0 wt %, and a DOP oil absorption of 30 mL/100 g
(D2) Irregularly shaped (non-spherical) aluminum hydroxide powder having an average particle size of 1.3 µm, an amount of particles at least 45 µm in size of 0.06 wt %, an amount of particles at least 75 µm in size of 0 wt %, and a DOP oil absorption of 50 mL/00 g
(D3) (for comparison) Irregularly shaped (non-spherical) aluminum hydroxide powder having an average particle size of 8.2 µm, an amount of particles at least 45 µm in size of 0.06 wt %, an amount of particles at least 75 µm in size of 0 wt %, and a DOP oil absorption of 90 mL/100 g (D4) (for comparison) Irregularly shaped (non-spherical) aluminum hydroxide powder having an average particle size of 1.2 μm, an amount of particles at least 45 μm in size of 0.06 wt %, an amount of particles at least 75 μm in size of 0 wt %, and a DOP oil absorption of 130 mL/100 g Component (E): A dimethylpolysiloxane of formula (7) below having an average degree of polymerization of 30 and capped at one end with a trimethoxysilyl group

[Chem. 17]

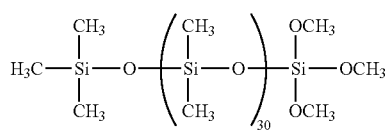

(7)

Component (F): A dimethylpolysiloxane of formula (8) below

[Chem. 18]

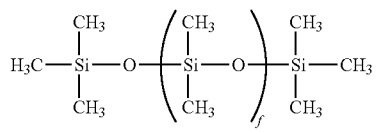

(8)

(wherein f=300)

(G): A synthetic resin film
 (G1) An aromatic polyimide film available under the trade name Kapton 50EN (from DuPont-Toray Co., Ltd.; 12.5 μm)
 (G2) A thermally conductive aromatic polyimide film available under the trade name Kapton 150MT (from DuPont-Toray Co., Ltd.; 37.5 μm)

Examples 1 to 4 and Comparative Examples 1 to 3

[Preparation of Thermally Conductive Silicone Compositions]

Thermally Conductive Silicone Compositions (a) to (e) were prepared by charging the ingredients in the amounts (parts by weight) shown in Table 1 into a Banbury mixer and mixing for 20 minutes.

The thermal conductivities of the resulting thermally conductive silicone compositions when cured were measured by the following methods. The results are shown in Table 1.

Thermal Conductivity

Using a 60 mm 60 mm 6 mm mold, the resulting silicone composition was pressed at 160° C. for 10 minutes under a pressure adjusted such that the thickness after curing becomes 6 mm, and was cured as a 6 mm-thick sheet. Using a thermal conductivity meter (available under the trade name TPS-2500S from Kyoto Electronics Manufacturing Co., Ltd.), the probe was inserted between two such sheets and the thermal conductivity of the sheets was measured.

TABLE 1

| Ingredients (pbw) | | Composition | | | | |
|---|---|---|---|---|---|---|
| | | (a) | (b) | (c) | (d) | (e) |
| Component (A) | (A1) | 100 | 70 | 70 | 100 | 100 |
| | (A2) | 0 | 20 | 20 | 0 | 0 |
| Component (B) | (B1) | 10 | 0 | 0 | 0 | 10 |
| | (B2) | 0 | 8 | 8 | 0 | 0 |
| Component (C) | | 10 | 10 | 10 | 20 | 10 |
| Component (D) | (D1) | 315 | 350 | 0 | 100 | 100 |
| | (D2) | 135 | 150 | 0 | 100 | 800 |
| | (D3) (for comparison) | 0 | 0 | 350 | 0 | 0 |
| | (D4) (for comparison) | 0 | 0 | 150 | 0 | 0 |
| Total amount of component (D) | | 450 | 500 | 500 | 200 | 900 |
| Component (E) | | 10 | 10 | 10 | 10 | 15 |
| Component (F) | | 0 | 10 | 10 | 0 | 0 |
| Amount of component (D) (pbw) per 100 pbw of combined amount of organosilicon compound components ((A) + (B) + (E) + (F)) | | 375 | 424 | 424 | 182 | 720 |
| Measurement results | | | | | | |
| Thermal conductivity (W/m · K) | | 1.7 | 1.8 | 1.9 | 0.8 | could not be compounded |

[Production of Thermally Conductive Sheets]
Coating onto Synthetic Resin Film

A coating material prepared by adding, to the thermally conductive silicone composition shown in Table 2 and obtained as described above, 40 wt % of toluene (based on the weight of the composition) and mixing in a planetary mixer was coated using a comma coater onto one side (front side) of a synthetic resin film so as to give an overall thickness (including the thickness of the synthetic resin film) after curing of 90 μm and heated for 10 minutes at 150° C., following which the coated film was taken up. Next, the other side (back side) of the synthetic resin film was similarly coated so as to give a total sheet thickness after curing of 150 μm and curing was similarly carried out, following which the coated film was taken up, thereby giving a thermally conductive sheet having an overall thickness of 150 μm.

In Comparative Example 3, coating onto the synthetic resin film was carried out as follows. The oven temperatures were set to, from the side closest to the comma portion, 60° C., 80° C. and 80° C., and the coating rate was set to 2 m/min. By lowering the oven temperature to a temperature that vaporizes the toluene and at which decomposition of the peroxide (C) does not occur, the product was obtained in an uncured state. This uncured product was cut to a suitable size and, using a pressing machine, the pressure was adjusted so as to give a thickness after curing of 130 μm and pressing was carried out at 170° C. for 10 minutes, giving a thermally conductive sheet.

[Properties and Stability of Thermally Conductive Sheet]

The thermal resistance and dielectric breakdown voltage in air of the resulting thermally conductive sheet, the bond strength between the synthetic resin film and the cured thermally conductive silicone composition, and the presence/absence of embrittlement following long-term high-temperature storage were measured and evaluated by the following methods. The results are shown in Table 2.

Thermal Resistance

Measured in accordance with ASTM D5470 at 50° C. and 0.69 MPa.

Dielectric Breakdown Voltage in Air

Measured in accordance with JIS K6249.

Bond Strength Between Synthetic Resin Film and Cured Layer of Thermally Conductive Silicone Composition The bond strength was measured by carrying out a 180-degree peel test in accordance with JIS K6259. Test specimens were prepared that had a two-layer structure obtained by applying the thermally conductive silicone composition onto the surface on one side of a 25 μm thick synthetic resin film and heat curing for 10 minutes at 150° C. so as to form a 1 mm thick cured layer of thermally conductive silicone composition.

Presence/Absence of Embrittlement after Long-Term, High-Temperature Storage

The resulting thermally conductive sheet was stored 1,000 hours at 150° C., following which it was examined for cracking when folded 180°.

The thermally conductive sheets of Examples 1 to 4 according to the invention were each continuously produced by coating and taken up into a roll. As is apparent from Table 2, they exhibited a low thermal resistance and high electrical insulating properties, and adhesion between the synthetic resin film and the cured thermally conductive silicone composition was good. Moreover, because embrittlement after high-temperature long-term aging did not arise, these thermally conductive sheets had an excellent long-term reliability.

On the other hand, in the sheet in Comparative Example 1, the amount of non-spherical thermally conductive filler (D) was lower than the range according to the invention, as a result of which the thermal resistance was high. Also, because an adhesion-imparting agent (B) was not included, the synthetic resin film and the cured layers of thermally conductive silicone composition ended up readily separating. In Comparative Example 2 in which D3 and D4 having large DOP oil absorptions were used, the wettability of the non-spherical thermally conductive filler to silicone was inadequate and the smoothness of the sheet surface during coating was compromised, resulting in an increased thermal resistance. Moreover, embrittlement after aging was observed. The sheet in Comparative Example 3 differed from that in Comparative Example 2 only in that the thermally conductive sheet was formed by pressing instead of by coating. By pressing, a sheet having low thermal resistance was obtained. However, when pressing is used, the sheet cannot be continuously produced and taken up into a roll. In addition, as in Comparative Example 2, embrittlement after aging was observed.

In composition (e) shown in Table 1, the amount of non-spherical thermally conductive filler (D) was higher than the range of the invention. As a result, a smooth compound was not obtained, and so coating was not carried out.

The invention claimed is:

1. A thermally conductive sheet comprising:
an electrically insulating synthetic resin film layer; and, on both sides of the synthetic resin film layer, a cured layer of a thermally conductive silicone composition, wherein the thermally conductive silicone composition comprises an adhesion-imparting agent-containing organosilicon compound component and a non-spherical thermally conductive filler, the thermally conductive filler included in an amount of from 250 to 600 parts by weight per 100 parts by weight of the organosilicon compound component and having a DOP oil absorption of 80 mL/100 g or less, wherein
the thermally conductive sheet has a dielectric breakdown voltage in air, as measured according to JIS K6249, of 9 kV or greater,

TABLE 2

|  |  | Example | | | | Comparative Example | | |
| --- | --- | --- | --- | --- | --- | --- | --- | --- |
|  |  | 1 | 2 | 3 | 4 | 1 | 2 | 3 |
| Synthetic resin film |  | (G1) | (G2) | (G1) | (G2) | (G1) | (G2) | (G2) |
| Composition for | Front side | (a) | (b) | (a) | (b) | (d) | (c) | (c) |
| thermally conductive cured layer | Back side | (a) | (b) | (b) | (a) | (d) | (c) | (c) |
|  | Measurement Results | | | | | | | |
| Thermal resistance (cm$^2$ · K/W) |  | 2.29 | 3.25 | 2.16 | 3.16 | 4.03 | 4.43 | 3.18 |
| Dielectric breakdown voltage in air (kV) |  | 9 | 14 | 10 | 15 | 7 | 13 | 14 |
| Bond strength (N/cm) |  | 20 | 22 | 18 | 21 | 2 | 17 | 22 |
| Embrittlement (cracking when folded) |  | no | no | no | no | no | yes | yes | said non-spherical thermally conductive filler is aluminum hydroxide powder, and
the aluminum hydroxide powder comprises:
   (1) from 100 to 500 parts by weight of an aluminum hydroxide powder having an average particle size of from 5 to 14 μm, an amount of particles having at least 45 μm in size of from 0 to 0.2 wt% and a DOP oil absorption of 50 mL/100 g or less; and
   (2) from 50 to 300 parts by weight of an aluminum hydroxide powder having an average particle size of from 0.5 to 3 μm, an amount of particles having at least 45 μm in size of from 0 to 0.1 wt% and a DOP oil absorption of 80 mL/100 g or less;
with (1) accounting for at least 50 wt % of the overall amount of non-spherical thermally conductive filler,
the synthetic resin film layer comprises at least one synthetic resin selected from the group consisting of an aromatic polyimide, a polyamide, a polyamide-imide, a polyester, a polyolefin, an aromatic polyether, and a fluoropolymer,
the adhesion imparting agent in the thermally conductive silicone composition is a silicon compound-based adhesion-imparting agent having an epoxy group and/or an alkoxy group, and also having at least one group selected from a vinyl group and a group of a formula Si-H, and
the organosilicon compound component in the thermally conductive silicone composition comprises:
   (A) an organopolysiloxane of average compositional formula (1) below $$R^1_a SiO_{(4-a)/2} \quad (1)$$

wherein each $R^1$ is independently a substituted or unsubstituted monovalent hydrocarbon group of 1 to 10 carbon atoms, and the subscript 'a' is from 1.90 to 2.05, the organopolysiloxane having at least two silicon-bonded alkenyl groups per molecule; and
   (C-2) an organic peroxide, as a curing agent (C), in an amount of 0.5 to 30 parts by weight based on 100 parts by weight of the organopolysiloxane.

2. The thermally conductive sheet of claim 1, wherein the synthetic resin used in the synthetic resin film layer has a melting point of at least 100° C.

3. The thermally conductive sheet of claim 1, wherein the adhesion-imparting agent is at least one compound selected from the group consisting of silicon compounds of the following formulas:

[Chem. 1]

[Chem. 2]

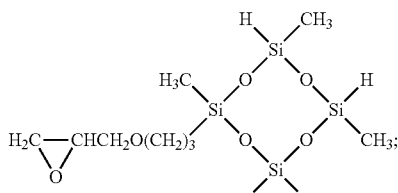

-continued

[Chem. 3]

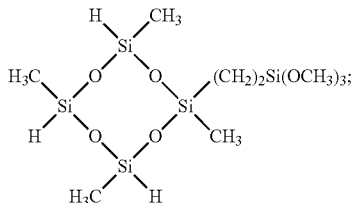

[Chem. 4]

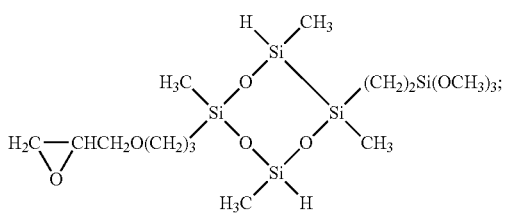

and

[Chem. 5]

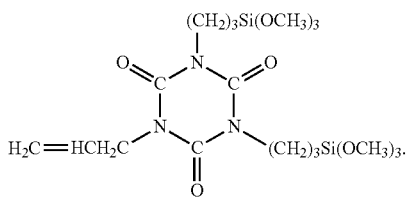

4. The thermally conductive sheet of claim 1, wherein the non-spherical thermally conductive filler in the thermally conductive silicone composition has an amount of particles having at least 45 μm in size of from 0 to 0.2 wt % and an amount of particles having at least 75 μm in size of from 0 to 0.01 wt %.

5. The thermally conductive sheet of claim 1, wherein the organosilicon compound component in the thermally conductive silicone composition further comprises (E) from 0.01 to 30 wt %, based on the total amount of the organosilicon compound component in the thermally conductive silicone composition, of one or more selected from:
   (E1) alkoxysilanes of general formula (2) below $$R^2_b R^3_c Si(OR^4)_{(4-b-c)} \quad (2)$$

wherein each $R^2$ is independently an alkyl group of 6 to 15 carbon atoms, each $R^3$ is independently a substituted or unsubstituted monovalent hydrocarbon group of 1 to 12 carbon atoms, each $R^4$ is independently an alkyl group of 1 to 6 carbon atoms, b is an integer from 1 to 3, c is 0, 1 or 2, and the sum b+c is from 1 to 3, and
   (E2) dimethylpolysiloxanes of general formula (3) below

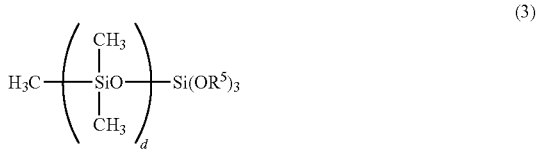

wherein each $R^5$ is independently an alkyl group of 1 to 6 carbon atoms, and d is an integer from 5 to 100, which are capped at one end with a trialkoxysilyl group.

6. The thermally conductive sheet of claim 1, wherein the thermally conductive silicone composition further comprises, as the curing agent (C):
- (C-1a) an organohydrogenpolysiloxane in an amount such that the total amount of silicon-bonded hydrogen atoms in the thermally conductive silicone composition per mole of the total amount of alkenyl groups in the thermally conductive silicone composition falls in the range of 0.8 to 10 moles; and
- (C-1b) a platinum catalyst in an amount such that the level of platinum metal in the platinum catalyst with respect to component (A), expressed in weight units, is from 0.1 to 2,000 ppm.

7. The thermally conductive sheet of claim 1, wherein the electrically insulating synthetic resin film layer has a thickness of from 5 to 90 μm, the cured layer of the thermally conductive silicone composition has a thickness of from 40 to 400 μm, and the overall thermally conductive sheet has a thickness of from 55 to 500 μm.

8. The thermally conductive sheet of claim 1, wherein the thermally conductive silicone composition, when cured, has a thermal conductivity of at least 1.2 W/m·K.

9. The thermally conductive sheet of claim 1, wherein
- (1) the aluminum hydroxide powder having an average particle size of from 5 to 14 μm has the amount of particles having at least 45 μm in size of from 0 to 0.04wt%; and
- (2) the aluminum hydroxide powder having an average particle size of from 0.5 to 3 μm has the amount of particles having at least 45 μm in size of from 0 to 0.06wt%.

10. The thermally conductive sheet of claim 1 which has the dielectric breakdown voltage in air of 10 kV or greater.

11. The thermally conductive sheet of claim 1 which has the dielectric breakdown voltage in air of 14 kV or greater.

* * * * *